US011967943B2

(12) United States Patent
Turner et al.

(10) Patent No.: US 11,967,943 B2
(45) Date of Patent: *Apr. 23, 2024

(54) TRANSVERSELY-EXCITED FILM BULK ACOUSTIC RESONATOR WITH ETCHED CONDUCTOR PATTERNS

(71) Applicant: Murata Manufacturing Co., Ltd., Nagaokakyo (JP)

(72) Inventors: Patrick Turner, San Bruno, CA (US); Ryo Wakabayashi, Santa Clara, CA (US)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/674,769

(22) Filed: Feb. 17, 2022

(65) Prior Publication Data
US 2022/0182038 A1    Jun. 9, 2022

Related U.S. Application Data

(63) Continuation of application No. 17/093,371, filed on Nov. 9, 2020, now Pat. No. 11,283,424.
(Continued)

(51) Int. Cl.
*H03H 9/17* (2006.01)
*H03H 3/02* (2006.01)
(Continued)

(52) U.S. Cl.
CPC .............. *H03H 9/174* (2013.01); *H03H 3/02* (2013.01); *H03H 9/02015* (2013.01);
(Continued)

(58) Field of Classification Search
CPC ...... H03H 9/174; H03H 3/02; H03H 9/02015; H03H 9/02031; H03H 9/02228;
(Continued)

(56) References Cited

U.S. PATENT DOCUMENTS 5,204,575 A    4/1993    Kanda et al.
5,274,345 A    12/1993   Gau
(Continued)

FOREIGN PATENT DOCUMENTS

CN    106788318 A    5/2017
CN    110417373 A    11/2019
(Continued)

OTHER PUBLICATIONS

A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.
(Continued)

*Primary Examiner* — Rakesh B Patel
*Assistant Examiner* — Jorge L Salazar, Jr.
(74) *Attorney, Agent, or Firm* — ARENTFOX SCHIFF LLP

(57) ABSTRACT

An acoustic resonator is fabricated by forming a patterned first photoresist mask on a piezoelectric plate at locations of a desired interdigital transducer (IDT) pattern. An etch-stop layer is then deposited on the plate and first photoresist mask. The first photoresist mask is removed to remove parts of the etch-stop and expose the plate. An IDT conductor material is deposited on the etch stop and the exposed plate. A patterned second photoresist mask is then formed on the conductor material at locations of the IDT pattern. The conductor material is then etched over and to the etch-stop to form the IDT pattern which has interleaved fingers on a diaphragm to span a substrate cavity. A portion of the plate and the etch-stop form the diaphragm. The etch-stop and photoresist mask are impervious to this etch. The second photoresist mask is removed to leave the IDT pattern.

20 Claims, 10 Drawing Sheets

Related U.S. Application Data

(60) Provisional application No. 63/019,749, filed on May 4, 2020.

(51) Int. Cl.
| | |
|---|---|
| *H03H 9/02* | (2006.01) |
| *H03H 9/13* | (2006.01) |
| *H03H 9/205* | (2006.01) |
| *H03H 9/54* | (2006.01) |
| *H03H 9/56* | (2006.01) |
| *H10N 30/06* | (2023.01) |

(52) U.S. Cl.
CPC .... *H03H 9/02031* (2013.01); *H03H 9/02228* (2013.01); *H03H 9/132* (2013.01); *H03H 9/176* (2013.01); *H03H 9/205* (2013.01); *H03H 9/547* (2013.01); *H03H 9/562* (2013.01); *H03H 9/564* (2013.01); *H03H 9/568* (2013.01); *H10N 30/06* (2023.02); *H03H 2003/023* (2013.01); *Y10T 29/42* (2015.01); *Y10T 29/49005* (2015.01)

(58) Field of Classification Search
CPC ........ H03H 9/132; H03H 9/176; H03H 9/205; H03H 9/547; H03H 9/562; H03H 9/564; H03H 9/568; H03H 2003/023; H10N 30/06; Y10T 29/42; Y10T 29/49005
USPC .......................................... 333/133, 193–196
See application file for complete search history.

(56) References Cited

U.S. PATENT DOCUMENTS

| | | | |
|---|---|---|---|
| 5,446,330 | A | 8/1995 | Eda et al. |
| 5,552,655 | A | 9/1996 | Stokes et al. |
| 5,726,610 | A | 3/1998 | Allen et al. |
| 5,729,186 | A | 3/1998 | Seki et al. |
| 5,853,601 | A | 12/1998 | Krishaswamy |
| 6,172,582 | B1 | 1/2001 | Hickernell |
| 6,271,617 | B1 | 8/2001 | Yoneda et al. |
| 6,377,140 | B1 | 4/2002 | Ehara et al. |
| 6,516,503 | B1 | 2/2003 | Ikada et al. |
| 6,540,827 | B1 | 4/2003 | Levy et al. |
| 6,570,470 | B2 | 5/2003 | Maehara et al. |
| 6,707,229 | B1 | 3/2004 | Martin |
| 6,710,514 | B2 | 3/2004 | Ikada et al. |
| 6,833,774 | B2 | 12/2004 | Abbott et al. |
| 7,009,468 | B2 | 3/2006 | Kadota et al. |
| 7,042,132 | B2 | 5/2006 | Bauer et al. |
| 7,345,400 | B2 | 3/2008 | Nakao et al. |
| 7,463,118 | B2 | 12/2008 | Jacobsen |
| 7,535,152 | B2 | 5/2009 | Ogami et al. |
| 7,684,109 | B2 | 3/2010 | Godshalk et al. |
| 7,728,483 | B2 | 6/2010 | Tanaka |
| 7,868,519 | B2 | 1/2011 | Umeda |
| 7,941,103 | B2 | 5/2011 | Iwamoto et al. |
| 7,965,015 | B2 | 6/2011 | Tai et al. |
| 8,278,802 | B1 | 10/2012 | Lee et al. |
| 8,294,330 | B1 | 10/2012 | Abbott et al. |
| 8,344,815 | B2 | 1/2013 | Yamanaka et al. |
| 8,816,567 | B2 | 8/2014 | Zuo et al. |
| 8,829,766 | B2 | 9/2014 | Milyutin et al. |
| 8,932,686 | B2 | 1/2015 | Hayakawa et al. |
| 9,093,979 | B2 | 7/2015 | Wang |
| 9,112,134 | B2 | 8/2015 | Takahashi |
| 9,130,145 | B2 | 9/2015 | Martin et al. |
| 9,148,121 | B2 | 9/2015 | Inoue |
| 9,219,466 | B2 | 12/2015 | Meltaus et al. |
| 9,240,768 | B2 | 1/2016 | Nishihara et al. |
| 9,276,557 | B1 | 3/2016 | Nordquist et al. |
| 9,369,105 | B1 | 6/2016 | Li et al. |
| 9,425,765 | B2 | 8/2016 | Rinaldi |
| 9,525,398 | B1 | 12/2016 | Olsson |
| 9,640,750 | B2 | 5/2017 | Nakanishi et al. |
| 9,748,923 | B2 | 8/2017 | Kando et al. |
| 9,762,202 | B2 | 9/2017 | Thalmayr et al. |
| 9,780,759 | B2 | 10/2017 | Kimura et al. |
| 9,837,984 | B2 | 12/2017 | Khlat et al. |
| 10,079,414 | B2 | 9/2018 | Guyette et al. |
| 10,187,039 | B2 | 1/2019 | Komatsu et al. |
| 10,200,013 | B2 | 2/2019 | Bower et al. |
| 10,211,806 | B2 | 2/2019 | Bhattacharjee |
| 10,284,176 | B1 | 5/2019 | Solal |
| 10,389,391 | B2 | 8/2019 | Ito et al. |
| 10,491,192 | B1 | 11/2019 | Plesski et al. |
| 10,601,392 | B2 | 3/2020 | Plesski et al. |
| 10,637,438 | B2 | 4/2020 | Garcia et al. |
| 10,644,674 | B2 | 5/2020 | Takamine |
| 10,756,697 | B2 | 8/2020 | Plesski et al. |
| 10,790,802 | B2 | 9/2020 | Yantchev et al. |
| 10,797,675 | B2 | 10/2020 | Plesski |
| 10,812,048 | B2 | 10/2020 | Nosaka |
| 10,819,309 | B1 | 10/2020 | Turner et al. |
| 10,826,462 | B2 | 11/2020 | Plesski et al. |
| 10,868,510 | B2 | 12/2020 | Yantchev et al. |
| 10,868,512 | B2 | 12/2020 | Garcia et al. |
| 10,868,513 | B2 | 12/2020 | Yantchev |
| 10,911,017 | B2 | 2/2021 | Plesski |
| 10,911,021 | B2 | 2/2021 | Turner et al. |
| 10,911,023 | B2 | 2/2021 | Turner |
| 10,917,070 | B2 | 2/2021 | Plesski et al. |
| 10,917,072 | B2 | 2/2021 | McHugh et al. |
| 10,985,726 | B2 | 4/2021 | Plesski |
| 10,985,728 | B2 | 4/2021 | Plesski et al. |
| 10,985,730 | B2 | 4/2021 | Garcia |
| 10,992,282 | B1 | 4/2021 | Plesski et al. |
| 10,992,283 | B2 | 4/2021 | Plesski et al. |
| 10,992,284 | B2 | 4/2021 | Yantchev |
| 10,998,877 | B2 | 5/2021 | Turner et al. |
| 10,998,882 | B2 | 5/2021 | Yantchev et al. |
| 11,003,971 | B2 | 5/2021 | Plesski et al. |
| 11,114,996 | B2 | 9/2021 | Plesski et al. |
| 11,114,998 | B2 | 9/2021 | Garcia et al. |
| 11,139,794 | B2 | 10/2021 | Plesski et al. |
| 11,143,561 | B2 | 10/2021 | Plesski |
| 11,146,231 | B2 | 10/2021 | Plesski |
| 11,146,232 | B2 | 10/2021 | Yandrapalli et al. |
| 11,146,238 | B2 | 10/2021 | Hammond et al. |
| 11,146,244 | B2 | 10/2021 | Yantchev |
| 11,165,407 | B2 | 11/2021 | Yantchev |
| 11,171,629 | B2 | 11/2021 | Turner |
| 11,201,601 | B2 | 12/2021 | Yantchev et al. |
| 11,283,424 | B2 * | 3/2022 | Turner .................. H10N 30/06 |
| 11,418,167 | B2 | 8/2022 | Garcia |
| 2002/0079986 | A1 | 6/2002 | Ruby et al. |
| 2002/0130736 | A1 | 9/2002 | Mukai |
| 2002/0158714 | A1 | 10/2002 | Kaitila et al. |
| 2002/0189062 | A1 | 12/2002 | Lin et al. |
| 2003/0042998 | A1 | 3/2003 | Edmonson |
| 2003/0080831 | A1 | 5/2003 | Naumenko et al. |
| 2003/0199105 | A1 | 10/2003 | Kub et al. |
| 2004/0041496 | A1 | 3/2004 | Imai et al. |
| 2004/0100164 | A1 | 5/2004 | Murata |
| 2004/0261250 | A1 | 12/2004 | Kadota et al. |
| 2005/0077982 | A1 | 4/2005 | Funasaka |
| 2005/0099091 | A1 | 5/2005 | Mishima et al. |
| 2005/0185026 | A1 | 8/2005 | Noguchi et al. |
| 2005/0218488 | A1 | 10/2005 | Matsuo |
| 2005/0264136 | A1 | 12/2005 | Tsutsumi et al. |
| 2006/0152107 | A1 | 7/2006 | Tanaka |
| 2006/0179642 | A1 | 8/2006 | Kawamura |
| 2007/0182510 | A1 | 8/2007 | Park |
| 2007/0188047 | A1 | 8/2007 | Tanaka |
| 2007/0194863 | A1 | 8/2007 | Shibata et al. |
| 2007/0267942 | A1 | 11/2007 | Matsumoto et al. |
| 2008/0246559 | A1 | 10/2008 | Ayazi |
| 2008/0297280 | A1 | 12/2008 | Thalhammer et al. |
| 2009/0315640 | A1 | 12/2009 | Umeda et al. |
| 2010/0019866 | A1 | 1/2010 | Hara et al. |
| 2010/0064492 | A1 | 3/2010 | Tanaka |
| 2010/0123367 | A1 | 5/2010 | Tai et al. |
| 2010/0212127 | A1 | 8/2010 | Heinze et al. |

(56) References Cited

U.S. PATENT DOCUMENTS

| | | |
|---|---|---|
| 2010/0301703 A1 | 12/2010 | Chen et al. |
| 2011/0018389 A1 | 1/2011 | Fukano et al. |
| 2011/0018654 A1 | 1/2011 | Bradley et al. |
| 2011/0102107 A1 | 5/2011 | Onzuka |
| 2011/0109196 A1 | 5/2011 | Goto et al. |
| 2011/0278993 A1 | 11/2011 | Iwamoto |
| 2012/0073390 A1 | 3/2012 | Zaghloul et al. |
| 2012/0198672 A1 | 8/2012 | Ueda et al. |
| 2012/0286900 A1 | 11/2012 | Kadota et al. |
| 2012/0326809 A1 | 12/2012 | Tsuda |
| 2013/0057360 A1 | 3/2013 | Meltaus et al. |
| 2013/0127551 A1 | 5/2013 | Yamanaka |
| 2013/0234805 A1 | 9/2013 | Takahashi |
| 2013/0271238 A1 | 10/2013 | Onda |
| 2013/0278609 A1 | 10/2013 | Stephanou et al. |
| 2013/0321100 A1 | 12/2013 | Wang |
| 2014/0009032 A1 | 1/2014 | Takahashi et al. |
| 2014/0009247 A1 | 1/2014 | Moriya |
| 2014/0113571 A1 | 4/2014 | Fujiwara et al. |
| 2014/0130319 A1 | 5/2014 | Iwamoto |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0225684 A1 | 8/2014 | Kando et al. |
| 2015/0014795 A1 | 1/2015 | Franosch et al. |
| 2015/0042417 A1 | 2/2015 | Onodera et al. |
| 2015/0165479 A1 | 6/2015 | Lasiter et al. |
| 2015/0319537 A1 | 11/2015 | Perois et al. |
| 2015/0333730 A1 | 11/2015 | Meltaus et al. |
| 2015/0365067 A1 | 12/2015 | Hori et al. |
| 2016/0028367 A1 | 1/2016 | Shealy |
| 2016/0036415 A1 | 2/2016 | Ikeuchi |
| 2016/0087187 A1 | 3/2016 | Burak |
| 2016/0149554 A1 | 5/2016 | Nakagawa |
| 2016/0182009 A1 | 6/2016 | Bhattacharjee |
| 2017/0063332 A1 | 3/2017 | Gilbert et al. |
| 2017/0104470 A1 | 4/2017 | Koelle et al. |
| 2017/0179225 A1 | 6/2017 | Kishimoto |
| 2017/0179928 A1 | 6/2017 | Raihn et al. |
| 2017/0187352 A1 | 6/2017 | Omura |
| 2017/0214381 A1 | 7/2017 | Bhattacharjee |
| 2017/0214387 A1 | 7/2017 | Burak et al. |
| 2017/0222617 A1 | 8/2017 | Mizoguchi |
| 2017/0222622 A1 | 8/2017 | Solal et al. |
| 2017/0264266 A1 | 9/2017 | Kishimoto |
| 2017/0290160 A1 | 10/2017 | Takano et al. |
| 2017/0359050 A1 | 12/2017 | Irieda et al. |
| 2017/0370791 A1 | 12/2017 | Nakamura et al. |
| 2018/0005950 A1 | 1/2018 | Watanabe |
| 2018/0013405 A1 | 1/2018 | Takata |
| 2018/0026603 A1 | 1/2018 | Iwamoto |
| 2018/0033952 A1 | 2/2018 | Yamamoto |
| 2018/0041191 A1 | 2/2018 | Park |
| 2018/0062615 A1 | 3/2018 | Kato et al. |
| 2018/0062617 A1 | 3/2018 | Yun et al. |
| 2018/0123016 A1 | 5/2018 | Gong |
| 2018/0152169 A1 | 5/2018 | Goto et al. |
| 2018/0191322 A1 | 7/2018 | Chang et al. |
| 2018/0278227 A1 | 9/2018 | Hurwitz |
| 2018/0316333 A1 | 11/2018 | Nakamura et al. |
| 2019/0007022 A1 | 1/2019 | Goto et al. |
| 2019/0068155 A1 | 2/2019 | Kimura et al. |
| 2019/0068164 A1 | 2/2019 | Houlden et al. |
| 2019/0123721 A1 | 4/2019 | Takamine |
| 2019/0131953 A1 | 5/2019 | Gong |
| 2019/0181825 A1 | 6/2019 | Schmalzl et al. |
| 2019/0181833 A1 | 6/2019 | Nosaka |
| 2019/0207583 A1 | 7/2019 | Miura et al. |
| 2019/0245518 A1 | 8/2019 | Ito |
| 2019/0273480 A1 | 9/2019 | Lin et al. |
| 2019/0348966 A1 | 11/2019 | Campanella-Pineda |
| 2019/0379351 A1 | 12/2019 | Miyamoto et al. |
| 2019/0386635 A1 | 12/2019 | Plesski et al. |
| 2019/0386636 A1 | 12/2019 | Plesski et al. |
| 2020/0007110 A1 | 1/2020 | Konaka et al. |
| 2020/0021272 A1 | 1/2020 | Segovia Fernandez et al. |
| 2020/0036357 A1 | 1/2020 | Mimura |
| 2020/0235719 A1 | 7/2020 | Yantchev et al. |
| 2020/0244247 A1 | 7/2020 | Maeda |
| 2020/0259480 A1 | 8/2020 | Pensala |
| 2020/0304091 A1 | 9/2020 | Yantchev |
| 2020/0313645 A1 | 10/2020 | Caron |
| 2020/0321939 A1 | 10/2020 | Turner et al. |
| 2020/0328728 A1 | 10/2020 | Nakagawa et al. |
| 2020/0350891 A1 | 11/2020 | Turner |
| 2021/0013859 A1 | 1/2021 | Turner et al. |
| 2021/0265978 A1 | 8/2021 | Plesski et al. |
| 2021/0273631 A1 | 9/2021 | Jachowski et al. |
| 2021/0313951 A1 | 10/2021 | Yandrapalli et al. |
| 2021/0328574 A1 | 10/2021 | Garcia |
| 2021/0351762 A1 | 11/2021 | Dyer et al. |
| 2022/0103160 A1 | 3/2022 | Jachowski et al. |
| 2022/0116015 A1 | 4/2022 | Garcia et al. |
| 2022/0123720 A1 | 4/2022 | Garcia et al. |
| 2022/0123723 A1 | 4/2022 | Garcia et al. |
| 2022/0149808 A1 | 5/2022 | Dyer et al. |
| 2022/0149814 A1 | 5/2022 | Garcia et al. |

FOREIGN PATENT DOCUMENTS

| | | |
|---|---|---|
| CN | 210431367 U | 4/2020 |
| CN | 113765495 A | 12/2021 |
| JP | H10209804 A | 8/1998 |
| JP | 2001244785 A | 9/2001 |
| JP | 2002300003 A | 10/2002 |
| JP | 2003078389 A | 3/2003 |
| JP | 2004096677 A | 3/2004 |
| JP | 2004129222 A | 4/2004 |
| JP | 2004304622 A | 10/2004 |
| JP | 2006173557 A | 6/2006 |
| JP | 2007251910 A | 9/2007 |
| JP | 2010062816 A | 3/2010 |
| JP | 2010103803 A | 5/2010 |
| JP | 2010233210 A | 10/2010 |
| JP | 2013528996 A | 7/2013 |
| JP | 2013214954 A | 10/2013 |
| JP | 2015054986 A | 3/2015 |
| JP | 2016001923 A | 1/2016 |
| JP | 2017526254 A | 9/2017 |
| JP | 2017220910 A | 12/2017 |
| JP | 2018093487 A | 6/2018 |
| JP | 2018166259 A | 10/2018 |
| JP | 2018207144 A | 12/2018 |
| JP | 2019186655 A | 10/2019 |
| JP | 2020113939 A | 7/2020 |
| WO | 2010047114 A1 | 4/2010 |
| WO | 2013021948 A1 | 2/2013 |
| WO | 2015098694 A1 | 7/2015 |
| WO | 2016017104 | 2/2016 |
| WO | 2016052129 A1 | 4/2016 |
| WO | 2016147687 A1 | 9/2016 |
| WO | 2018003273 | 1/2018 |
| WO | 2018163860 A1 | 9/2018 |
| WO | 2019138810 A1 | 7/2019 |
| WO | 2020092414 A2 | 5/2020 |

OTHER PUBLICATIONS

Acoustic Properties of Solids ONDA Corporation 592 Weddell Drive, Sunnyvale, CA 94089, Apr. 11, 2003, pp. 5 (Year 2003). 2003.

Bahreyni, B. Fabrication and Design of Resonant Microdevices Andrew William, Inc. 2018, NY (Year 2008). 2008.

Buchanan "Ceramic Materials for Electronics" 3rd Edition, first published in 2004 by Marcel Dekker, Inc. pp. 496 (Year 2004). 00 Jan. 2004.

Ekeom, D. & Dubus, Bertrand & Volatier, A . . . (2006). Solidly mounted resonator (SMR) FEM-BEM simulation. 1474-1477. 10.1109/ULTSYM.2006.371.

G. Manohar, "Investigation of Various Surface Acoustic Wave Design Configurations for Improved Sensitivity." Doctoral dissertation, University of South Florida, USA, Jan. 2012, 7 pages.

(56) References Cited

OTHER PUBLICATIONS

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.

M. Kadota et al.; "Ultrawide Band Ladder Filter using SH0 plate Wave in Thin LiNb03 Plate and its Application"; 2014 IEEE International Ultrasonics Symposium Proceedings, 2014, pp. 2031-2034. (Year: 2014).

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

M.-H. Li et al.; "Temperature Stability Analysis of Thin-Film Lithium Niobate SH0 Plate Wave Resonators"; Journal of Microelectromechanical Systems, vol. 28, No. 5, Oct. 2019, pp. 799-809. (Year: 2019).

Material Properties of Tibtech Innovations, © 2018 TIBTECH Innovations (Year 2018). 2018.

Merriam Webster, dictionary meaning of the word "diaphragm", since 1828, Merriam Webster (Year: 1828) 1828.

Mizutaui, K. and Toda, K., "Analysis of lamb wave propagation characteristics in rotated Ycut Xpropagation LiNbO3 plates." Electron. Comm. Jpn. Pt. I, 69, No. 4 (1986): 47-55. doi:10.1002/ecja.4410690406.

Moussa et al. Review on Triggered Liposomal Drug Delivery with a Focus on Ultrasound 2015, Bentham Science Publishers, pp. 16 (Year 2005) 2005.

Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.

Naumenko et al., "Optimal orientations of Lithium Niobate for resonator SAW filters", 2003 IEEE Ultrasonics Symposium—pp. 2110-2113. (Year: 2003).

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

Rodriguez-Madrid et al., "Super-High-Frequency SAW Resonators on AlN/Diamond", IEEE Electron Device Letters, vol. 33, No. 4, Apr. 2012, pp. 495-497. Year: 2012) 2012.

Safari et al. "Piezoelectric for Transducer Applications" published by Elsevier Science Ltd., pp. 4 (Year: 2000). 2020.

Santosh, G., Surface acoustic wave devices on silicon using patterned and thin film ZnO, Ph.D. thesis, Feb. 2016, Indian Institute of technology Guwahati, Assam, India Feb. 2016.

Sorokin et al.Study of Microwave Acoustic Attenuation in a Multifrequency Bulk Acoustic Resonator Based on a Synthetic Diamond Single CrystalPublished in Acoustical Physics, vol. 61, No. 6, 2015 pp. 675 (Year 2015) 00 Jan. 2015.

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

USPTO/ISA, International Search Report and Written Opinion for PCT Application No. PCT/US2020/45654 dated Oct. 29, 2020.

USPTO/ISA, International Search Report and Written Opinion for PCT Application No. PCT/US2021/024824 dated Jul. 27, 2021, 9 total pages.

USPTO/ISA, International Search Report and Written Opinion for PCT Application No. PCT/US2021/048505 dated Dec. 1, 2021, 11 total pages.

Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.

Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.

Zou, Jie "High-Performance Aluminum Nitride Lamb Wave Resonators for RF Front-End Technology" University of California, Berkeley, Summer 2015, pp. 63 (Year 2015) 00 Jan. 2015.

Chen et al., "Development and Application of SAW Filter," Micromachines, Apr. 20, 2022, vol. 13, No. 656, pp. 1-15.

Hermann et al., "Properties of shear-horizontal surface acoustic waves in different layered quartz-SiO2 structures," Ultrasonics, 1999, vol. 37, pp. 335-341.

International Search Report and Written Opinion in PCT/US2022/081068, mailed Apr. 18, 2023, 17 pages.

Lam et al., "A Review of Lame and Lamb Mode Crystal Resonators for Timing Applications and Prospects of Lame and Lamb Mode Piezo MEMS Resonators for Filtering Applications," 2018 International Symposium on Acoustic Wave Devices for Future Mobile Communication Systems, Mar. 6-7, 2018, 12 pages.

Kadota et al., "Ultra Wideband Ladder Filter Using SH0 Plate Wave in Thin LiNbO3 Plate and Its Application to Tunable Filter," IEEE Transactions on Ultrasonics, Ferroelectrics, and Frequency Control, 2015, vol. 62, No. 5, pp. 939-946.

Gorisse et al., "Lateral Field Excitation of membrane-based Aluminum Nitride resonators", 2011 Joint Conference of the IEEE International Frequency Control and the European Frequency and Time Forum (FCS) Proceedings, 5 pages.

Pang et al. "Self-Aligned Lateral Field Excitation Film Acoustic Resonator with Very Large Electromechanical Coupling", 2004 IEEE International Ultrasonics, Ferroelectrics and Frequency Control Joint 50th Anniversary Conference, pp. 558-561.

Xue et al. "High Q Lateral-Field-Excited Bulk Resonator Based on Single-Crystal LiTaO3 for 5G Wireless Communication", Journal of Electron devices society, vol. 9, Mar. 26, 2021, pp. 353-358.

Yandrapalli et al., "Toward Band n78 Shear Bulk Acoustic Resonators Using Crystalline Y-Cut Lithium Niobate Films with Spurious Suppression", Journal of Microelectromechanical Systems, vol. 32, No. 4, Aug. 2023, pp. 327-334.

\* cited by examiner

TRANSVERSELY-EXCITED FILM BULK ACOUSTIC RESONATOR WITH ETCHED CONDUCTOR PATTERNS

RELATED APPLICATION INFORMATION

This patent is a continuation of U.S. patent application Ser. No. 17/093,371, filed Nov. 9, 2020, entitled TRANSVERSELY-EXCITED FILM BULK ACOUSTIC RESONATOR WITH ETCHED CONDUCTOR PATTERNS, which claims priority to U.S. provisional patent application No. 63/019,749, titled ETCH STOP LAYER TO ENABLE DEP-ETCH OF IDTS, filed May 4, 2020, which are incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

The desire for wider communication channel bandwidths will inevitably lead to the use of higher frequency communications bands. The current LTE™ (Long Term Evolution) specification defines frequency bands from 3.3 GHz to 5.9 GHz. These bands are not presently used. Future proposals for wireless communications include millimeter wave communication bands with frequencies up to 28 GHz.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies proposed for future communications networks.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
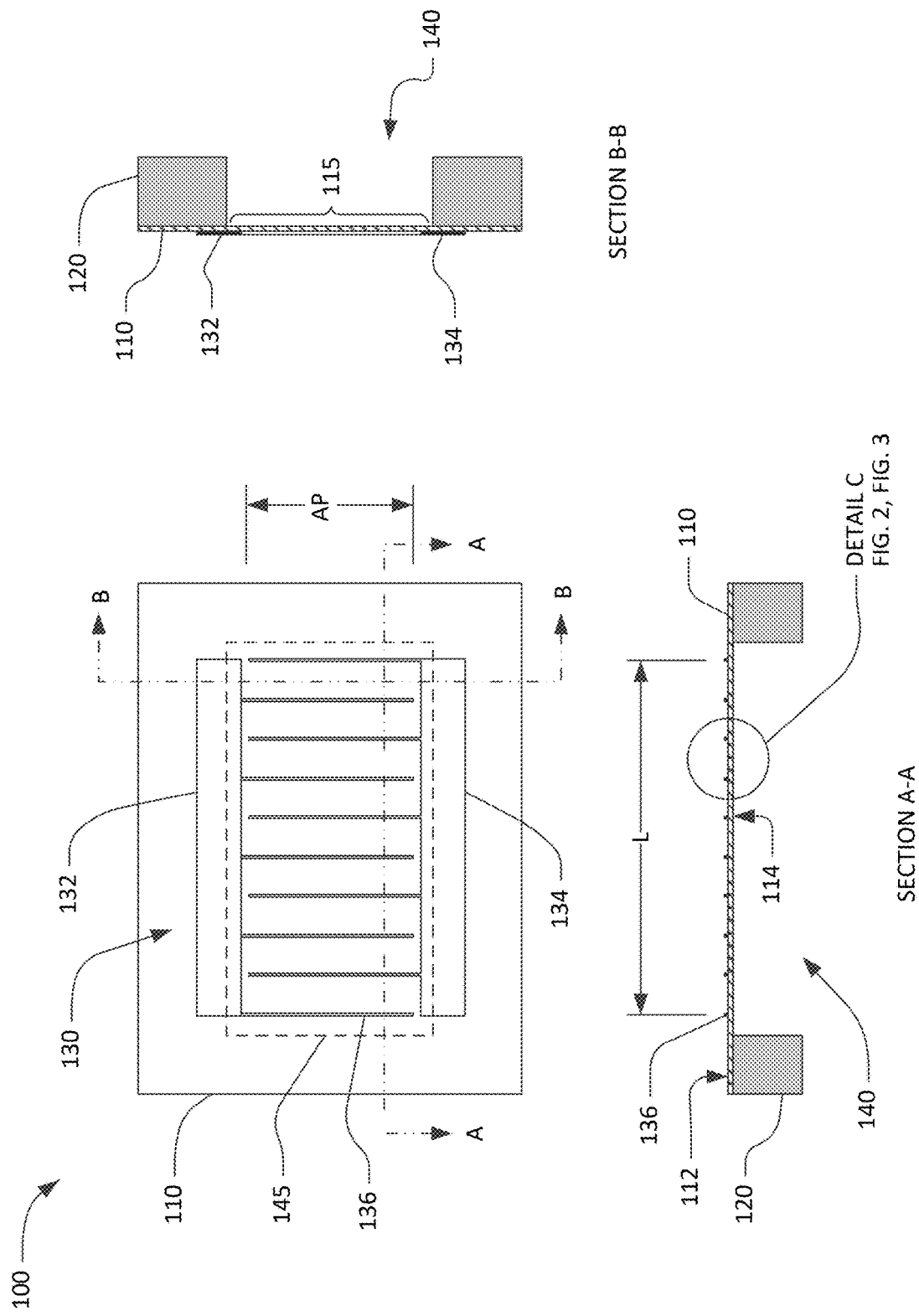
FIG. 1 includes a schematic plan view and two schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are Z-cut, which is to say the Z axis is normal to the front and back surfaces 112, 114. However, XBARs may be fabricated on piezoelectric plates with other crystallographic orientations.

The back surface 114 of the piezoelectric plate 110 is attached to a surface of the substrate 120 except for a portion of the piezoelectric plate 110 that forms a diaphragm 115 spanning a cavity 140 formed in the substrate. The portion of the piezoelectric plate that spans the cavity is referred to herein as the "diaphragm" 115 due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item".

The substrate 120 provides mechanical support to the piezoelectric plate 110. The substrate 120 may be, for example, silicon, sapphire, quartz, or some other material or combination of materials. The back surface 114 of the piezoelectric plate 110 may be bonded to the substrate 120 using a wafer bonding process. Alternatively, the piezoelectric plate 110 may be grown on the substrate 120 or attached to the substrate in some other manner. The piezoelectric plate 110 may be attached directly to the substrate or may be attached to the substrate 120 via one or more intermediate material layers.

"Cavity" has its conventional meaning of "an empty space within a solid body." The cavity 140 may be a hole completely through the substrate 120 (as shown in Section A-A and Section B-B) or a recess in the substrate 120. The cavity 140 may be formed, for example, by etching a portion of the substrate 120 to form a separate cavity for a resonator, before or after the piezoelectric plate 110 and the substrate 120 are attached. This etch may be selective by having a chemistry to etch the material of the substrate but not the material piezoelectric plate.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. As will be discussed in further detail, the primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the portion 115 of the piezoelectric plate that spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2:
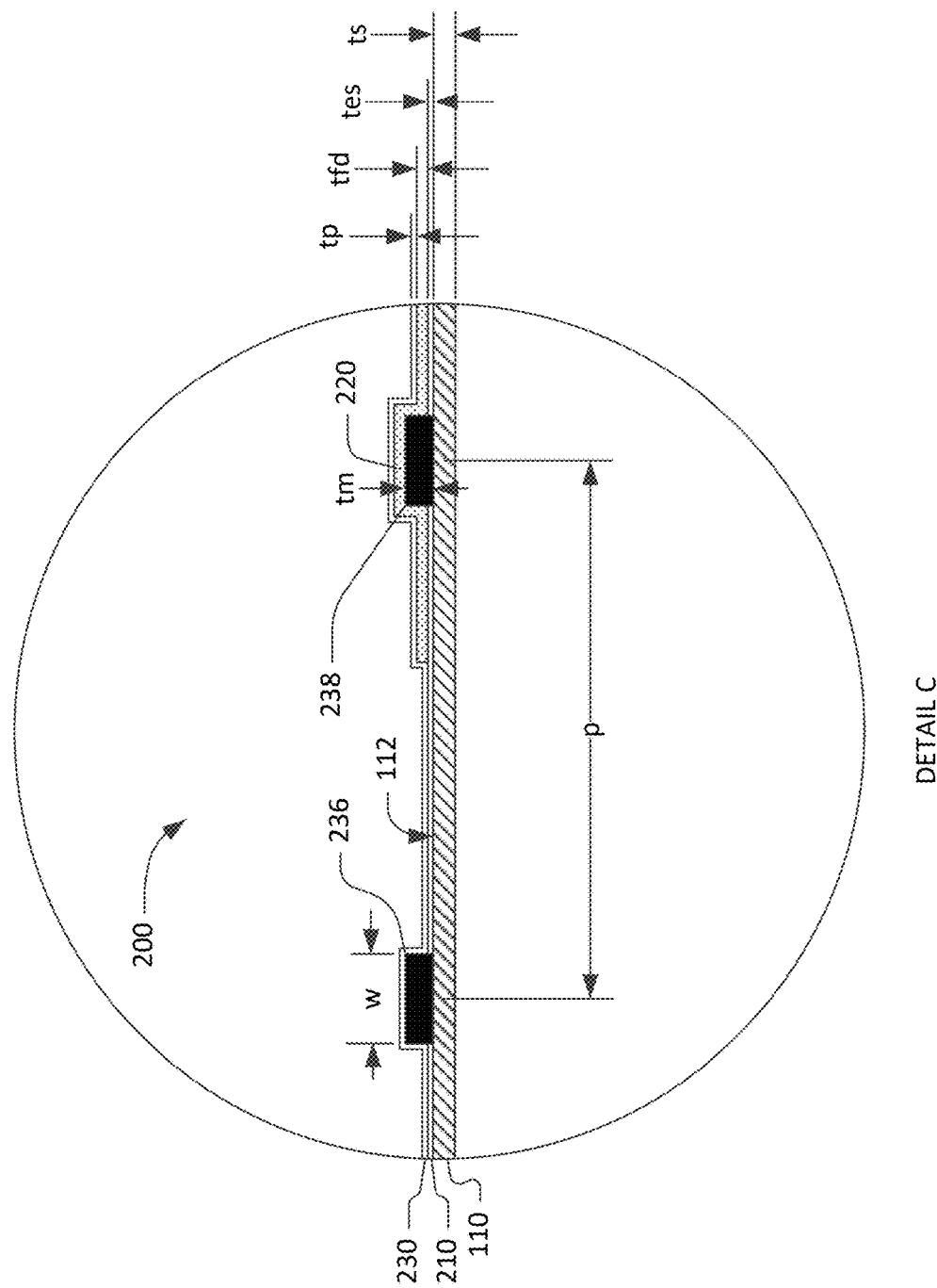
FIG. 2 is an expanded schematic cross-sectional view of a portion of an XBAR with an etch-stop layer.

FIG. 2 is an expanded schematic cross-sectional view of a portion of another XBAR device 200 including an etch-stop layer. The piezoelectric plate 110 is a single-crystal layer of piezoelectrical material having a thickness ts. ts may be, for example, 100 nm to 1500 nm.

The width of XBAR IDT fingers may be 500 nm or greater. The thickness tm of the IDT fingers may be from 100 nm to about equal to the width w. The thickness of the busbars (132, 134 in FIG. 1) of the IDT may be the same as, or greater than, the thickness tm of the IDT fingers.

FIG. 2 also shows two IDT fingers 236, 238 formed on the piezoelectric plate 110 which is a portion of the diaphragm of the XBAR device 200. Traditionally, the IDT fingers, such as the fingers 236, 238, and other conductors of an XBAR device have been formed using a lift-off photolithography process. Photoresist is deposited over the piezoelectric plate and patterned to define the conductor pattern. The IDT conductor layer and, optionally, one or more other layers are deposited in sequence over the surface of the piezoelectric plate. The photoresist may then be removed, which removes, or lifts off, the excess material, leaving the conductor pattern including the IDT fingers. Using a lift-off process does not expose the surface 112 of the piezoelectric plate to reactive chemicals. However, it may be difficult to control the sidewall angle of conductors formed using a lift-off process.

In the XBAR device 200, the IDT fingers 236, 238 are formed using a subtractive or etching process that may provide good control of conductor sidewall angles. One or more metal layers are deposited in sequence over the surface of the piezoelectric plate. The excess metal is then be removed by an anisotropic etch through the conductor layer where it is not protected by a patterned photoresist. The conductor layer can be etched, for example, by anisotropic plasma etching, reactive ion etching, wet chemical etching, and other etching technique.

To protect the surface 112 of the piezoelectric plate 110 from being damaged by the process and chemicals used to etch the conductor layers, the XBAR device 200 includes an etch-stop layer 210 formed on the surface 112 of the piezoelectric plate 110. In FIG. 2, the etch stop layer 210 is shown between but not under the IDT fingers 236, 238. The etch-stop layer 210 may be formed over the entire surface of the piezoelectric plate except under all of the IDT fingers. Alternatively, the etch-stop layer 210 may be formed over the entire surface of the piezoelectric plate except under all conductors.

The etch-stop layer 210 protects the front surface 112 of the piezoelectric plate 110 from the etch process. To this end, the etch-stop layer 210 must be impervious to the etch process or be etched magnitudes slower than the conductor by the etch process. The words "impervious to" have several definitions including "not affected by" and "not allowing etching or to pass through". Both of these definitions apply to the etch-stop layer 210. The etch-stop layer is not materially affected by the etch process and does not allow the liquid or gaseous etchant used in the etch process to penetrate to the piezoelectric plate 110. The etch-stop layer need not be inert with respect to the etchant but must be highly resistant to the etchant such that a substantial portion of the thickness of the etch stop layer remains after completion of the conductor etch. The remaining etch stop layer 210 is not removed after the IDT fingers 236, 238 and other conductors are formed and becomes a portion of the diaphragm of the XBAR device 200.

The etch-stop layer 210 is formed from an etch-stop material. The etch-stop material must be a dielectric with very low electrical conductivity and low acoustic loss. The etch-stop material must have high adhesion to the surface 112 on which it is deposited. Most importantly, the etch-stop material must be impervious, as previously defined, to the processes and chemicals used to etch the conductors. Alternatively, the etch-stop material must be etched magnitudes slower than the conductor by the processes and chemicals used to etch the conductors. In some cases, a viable etch stop material must withstand the chemistry used to etch IDT material. A material chosen for etch stop purposes may be either etchable with chemistry that does not etch the piezoelectric plate, or be a material that does not degrade the performance of the resonator(s). Suitable etch-stop materials may include oxides such as aluminum oxide and silicon dioxide, sapphire, nitrides including silicon nitride, aluminum nitride, and boron nitride, silicon carbide, and diamond. In some cases, it is an etch stop metal oxide layer.

The XBAR device 200 may include one or more additional dielectric layers that are shown in FIG. 2. A front side dielectric layer 220 may be formed over the IDTs of some (e.g., selected ones) of the XBAR devices in a filter. The "front side" of the XBAR is, by definition, the surface facing away from the substrate. The front-side dielectric layer 220 has a thickness tfd. The front-side dielectric layer 220 may be formed between the IDT fingers 226 and 228. In FIG. 2, the front side dielectric 220 covers the IDT finger 238 but not the IDT finger 236. In a filter, the front side dielectric may be formed over all of the fingers of some XBAR devices. For example, a front side dielectric layer may be formed over the IDTs of shunt resonators to lower the resonance frequencies of the shunt resonators with respect to the resonance frequencies of series resonators. Some filters may include two or more different thicknesses of front side dielectric over various resonators. A back-side dielectric layer (not shown) may optionally be formed on the back side of the piezoelectric plate 110.

Further, a passivation layer 230 may be formed over the entire surface of the XBAR device 200 except for contact pads where electric connections are made to circuity external to the XBAR device. The passivation layer is a thin dielectric layer intended to seal and protect the surfaces of the XBAR device while the XBAR device is incorporated into a package. The front side dielectric layer 220, backside dielectric and the passivation layer 230 may each be, $SiO_2$, $Si_3N_4$, $Al_2O_3$, some other dielectric material, or a combination of these materials.

Thickness tp may be a thickness that is selected to protect the piezoelectric plate and the metal electrodes from water and chemical corrosion, particularly for power durability purposes. The typical layer thickness tp may range from 10 to 100 nm. The passivation material may consist of multiple oxide and/or nitride coatings such as $SiO2$ and $Si3N4$ material.

Examples of thickness tes include between 10 to 30 nm. Thickness tes may be a thickness that is selected to ensure that the etch-stop layer cannot be etched completely through by the etch process used to etch the conductor material that forms the IDT.

Figure 3:
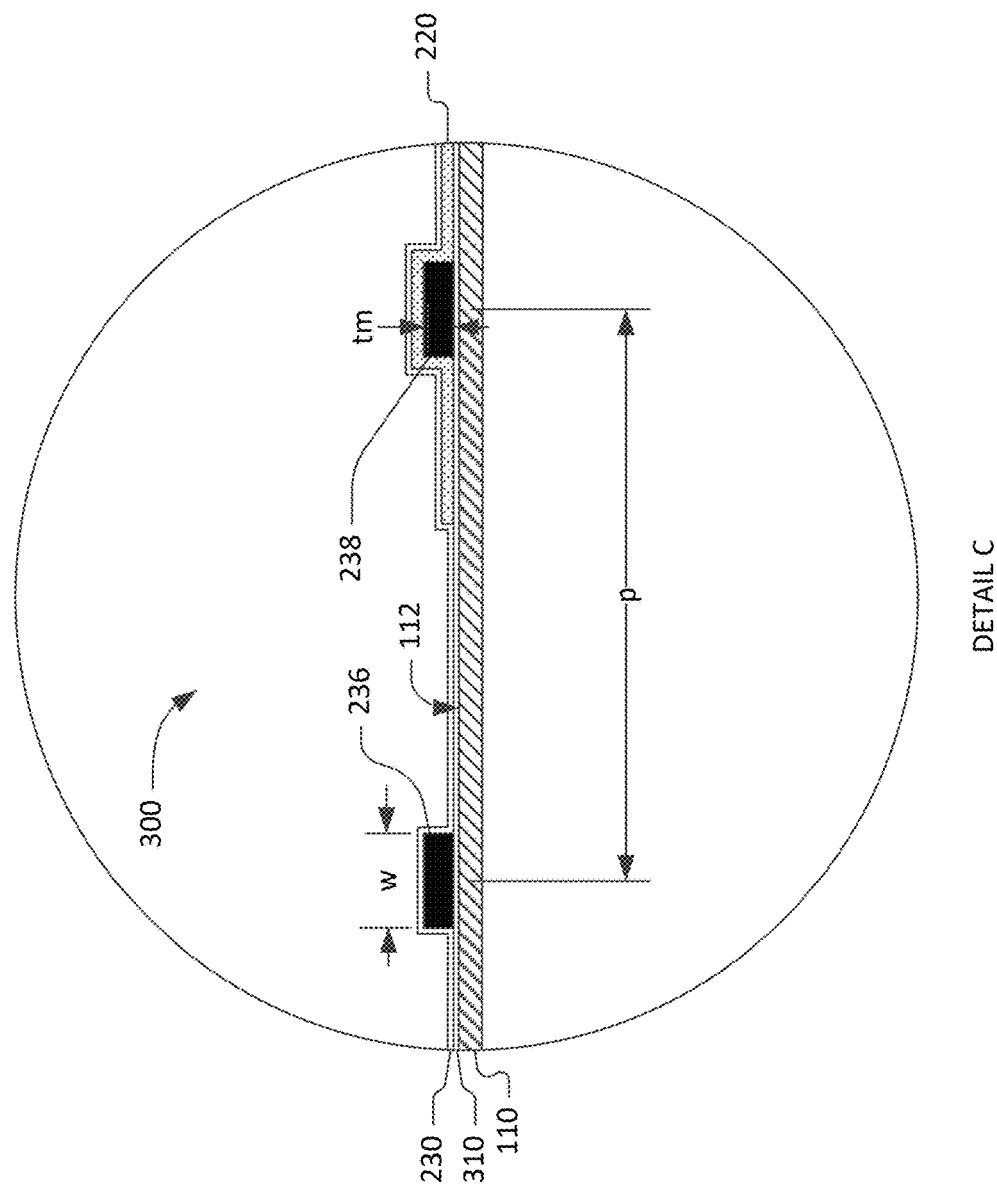
FIG. 3 is an expanded schematic cross-sectional view of a portion of another XBAR with an etch-stop layer.

FIG. 3 is an expanded schematic cross-sectional view of a portion of another XBAR device 300 including an etch-stop layer. FIG. 3 shows two IDT fingers 236, 238 formed on a piezoelectric plate 110 which is a portion of the diaphragm of the XBAR device 300. The exception of the etch-stop layer 310, all of the elements of the XBAR device 300 have the same function and characteristics as the corresponding element of the XBAR device 200 of FIG. 2. Descriptions of these elements will not be repeated.

The XBAR device 300 differs from the XBAR device 200 in that the etch stop layer 310 extends over the entire surface 112 of the piezoelectric plate 110 including under the IDT fingers 236, 238. The etch-stop layer 310 may be formed over the entire surface of the piezoelectric plate including under all of the conductors including the IDT fingers. The etch-stop layer 310 is an etch-stop material as previously described.

Figure 4:
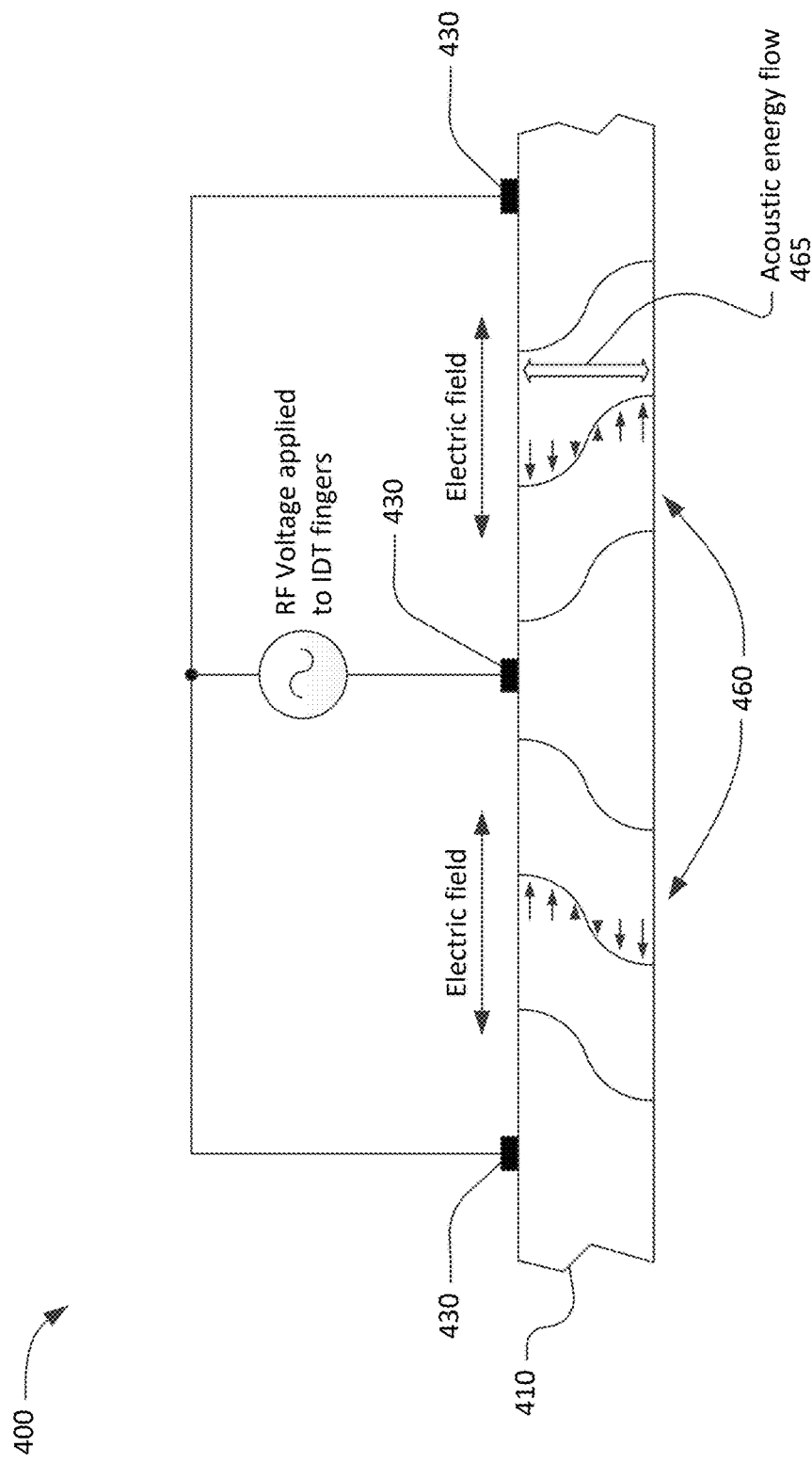
FIG. 4 is a graphic illustrating a shear horizontal acoustic mode in an XBAR.

FIG. 4 is a graphical illustration of the primary acoustic mode of interest in an XBAR. FIG. 4 shows a small portion of an XBAR 400 including a piezoelectric plate 410 and three interleaved IDT fingers 430. An RF voltage is applied to the interleaved fingers 430. This voltage creates a time-varying electric field between the fingers. The direction of the electric field is lateral, or parallel to the surface of the piezoelectric plate 410, as indicated by the arrows labeled "electric field". Due to the high dielectric constant of the piezoelectric plate, the electric field is highly concentrated in the plate relative to the air. The lateral electric field introduces shear deformation, and thus strongly excites a primary shear-mode acoustic mode, in the piezoelectric plate 410. In this context, "shear deformation" is defined as deformation in which parallel planes in a material remain parallel and maintain a constant distance while translating relative to each other. A "shear acoustic mode" is defined as an acoustic vibration mode in a medium that results in shear deformation of the medium. The shear deformations in the XBAR 400 are represented by the curves 460, with the adjacent small arrows providing a schematic indication of the direction and magnitude of atomic motion. The degree of atomic motion, as well as the thickness of the piezoelectric plate 410, have been greatly exaggerated for ease of visualization. While the atomic motions are predominantly lateral (i.e. horizontal as shown in FIG. 4), the direction of acoustic energy flow of the excited primary shear acoustic mode is substantially orthogonal to the surface of the piezoelectric plate, as indicated by the arrow 465.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. In such devices, the acoustic mode is compressive with atomic motions and the direction of acoustic energy flow in the thickness direction. In addition, the piezoelectric coupling for shear wave XBAR resonances can be high (>20%) compared to other acoustic resonators. High piezoelectric coupling enables the design and implementation of microwave and millimeter-wave filters with appreciable bandwidth.

Figure 5:
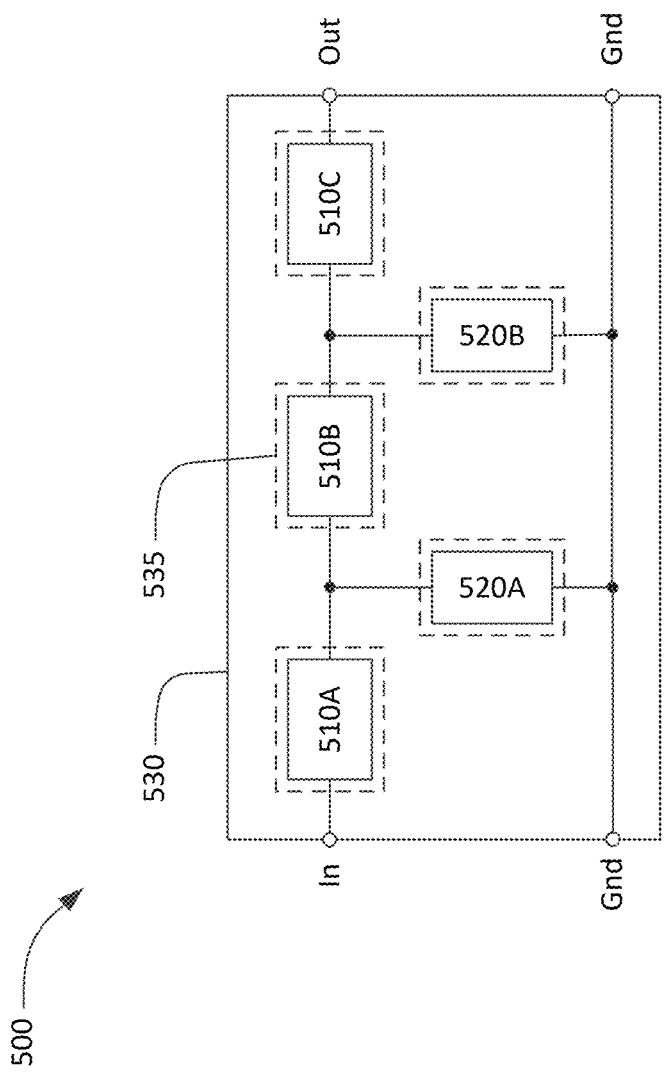
FIG. 5 is a schematic block diagram of a filter using XBARs.

FIG. 5 is a schematic circuit diagram and layout for a high frequency band-pass filter 500 using XBARs. The filter 500 has a conventional ladder filter architecture including three series resonators 510A, 510B, 510C and two shunt resonators 520A, 520B. The three series resonators 510A, 510B, and 510C are connected in series between a first port and a second port. In FIG. 5, the first and second ports are labeled "In" and "Out", respectively. However, the filter 500 is bidirectional and either port and serve as the input or output of the filter. The two shunt resonators 520A, 520B are connected from nodes between the series resonators to ground. All the shunt resonators and series resonators are XBARs.

The three series resonators 510A, B, C and the two shunt resonators 520A, B of the filter 500 are formed on a single plate 530 of piezoelectric material bonded to a silicon substrate (not visible). Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 5, the cavities are illustrated schematically as the dashed rectangles (such as the rectangle 535). In this example, each IDT is disposed over a respective cavity. In other filters, the IDTs of two or more resonators may be disposed over a single cavity.

Description of Methods

Figure 6:
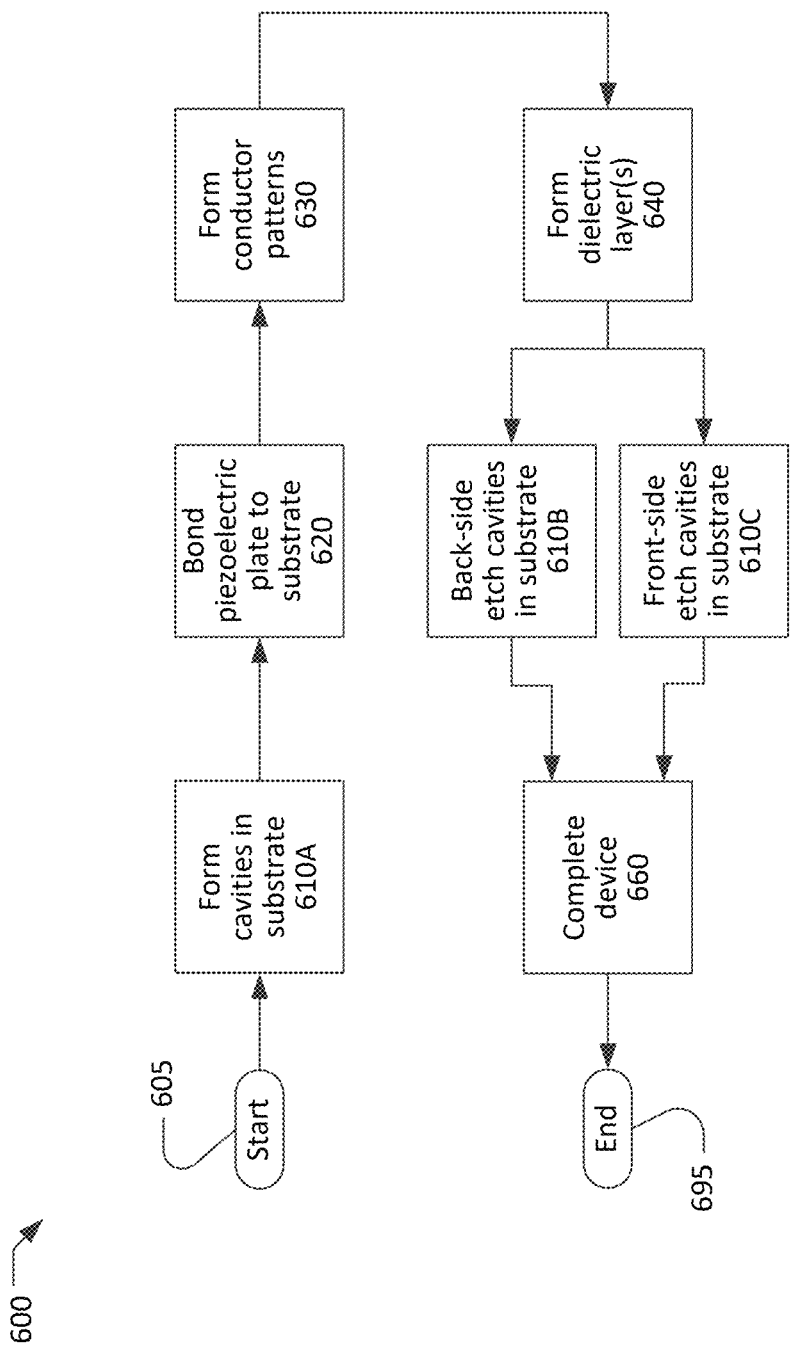
FIG. 6 is a flow chart of a process for fabricating an XBAR.

FIG. 6 is a simplified flow chart showing a process 600 for making an XBAR or a filter incorporating XBARs. The process 600 starts at 605 with a substrate 120 and a plate of piezoelectric material 110 and ends at 695 with a completed XBAR or filter. The flow chart of FIG. 6 includes only major process steps. Various conventional process steps (e.g. surface preparation, chemical mechanical processing (CMP), cleaning, inspection, baking, annealing, monitoring, testing, etc.) may be performed before, between, after, and during the steps shown in FIG. 6.

The flow chart of FIG. 6 captures three variations of the process 600 for making an XBAR which differ in when and how cavities are formed in the substrate 120. The cavities may be formed at steps 610A, 610B, or 610C. Only one of these steps is performed in each of the three variations of the process 600.

The piezoelectric plate 110 may be, for example, Z-cut lithium niobate or lithium tantalate as used in the previously presented examples. The piezoelectric plate may be some other material and/or some other cut. The substrate may preferably be silicon. The substrate may be some other material that allows formation of deep cavities by etching or other processing.

In one variation of the process 600, one or more cavities are formed in the substrate 120 at 610A, before the piezoelectric plate is bonded to the substrate at 620. A separate cavity may be formed for each resonator in a filter device. The one or more cavities may be formed using conventional photolithographic and etching techniques. These techniques may be isotropic or anisotropic. Typically, the cavities formed at 610A will not penetrate through the substrate.

At 620, the piezoelectric plate 110 is bonded to the substrate 120. The piezoelectric plate and the substrate may be bonded by a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

A conductor pattern, including IDTs of each XBAR, is formed at 630 by depositing and patterning one or more conductor layer on the front side of the piezoelectric plate. Alternative techniques to form the conductor pattern will be discuss subsequently with respect to FIG. 7 and FIG. 8. In some cases, forming at 630 occurs prior to bonding at 620, such as where the IDT's are formed prior to bonding the plate to the substrate.

At 640, a front-side dielectric layer or layers may be formed by depositing one or more layers of dielectric material on the front side of the piezoelectric plate, over one or more desired conductor patterns of IDT or XBAR devices. The one or more dielectric layers may be deposited using a conventional deposition technique such as sputtering, evaporation, or chemical vapor deposition. The one or more dielectric layers may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate. In some cases, depositing at 640 includes depositing a first thickness of at least one dielectric layer over the front-side surface of selected IDTs, but no dielectric or a second thickness less than the first thickness of at least one dielectric over the other IDTs. An alternative is where these dielectric layers are only between the interleaved fingers of the IDTs.

In a second variation of the process 600, one or more cavities are formed in the back side of the substrate 120 at 610B. A separate cavity may be formed for each resonator in a filter device. The one or more cavities may be formed using an anisotropic or orientation-dependent dry or wet etch to open holes through the back-side of the substrate to the piezoelectric plate. In this case, the resulting resonator devices will have a cross-section as shown in FIG. 1.

In a third variation of the process 600, one or more cavities in the form of recesses in the substrate 120 may be formed at 610C by etching the front side of the substrate using an etchant introduced through openings in the piezoelectric plate. A separate cavity may be formed for each resonator in a filter device.

In all variations of the process 600, the filter or XBAR device is completed at 660. Actions that may occur at 660 include depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. After the filter device is completed, the process ends at 695. FIGS. 2 and 3 may show examples of the fingers of selected IDTs after completion at 660.

Figure 7A:
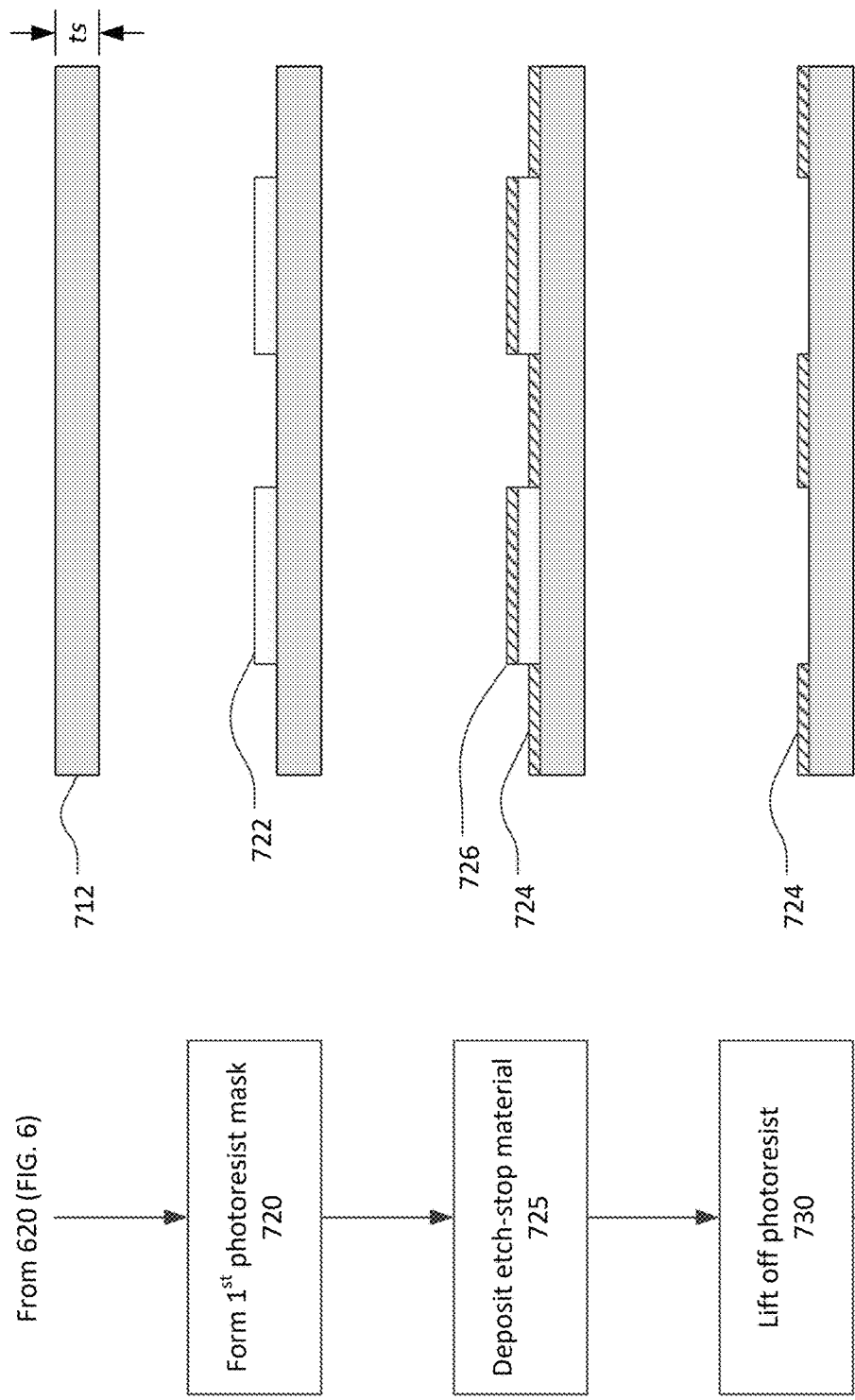
FIG. 7A and FIG. 7B are collectively a flow chart of a process for forming a conductor pattern using dry etching and an etch-stop layer.
Figure 7B:
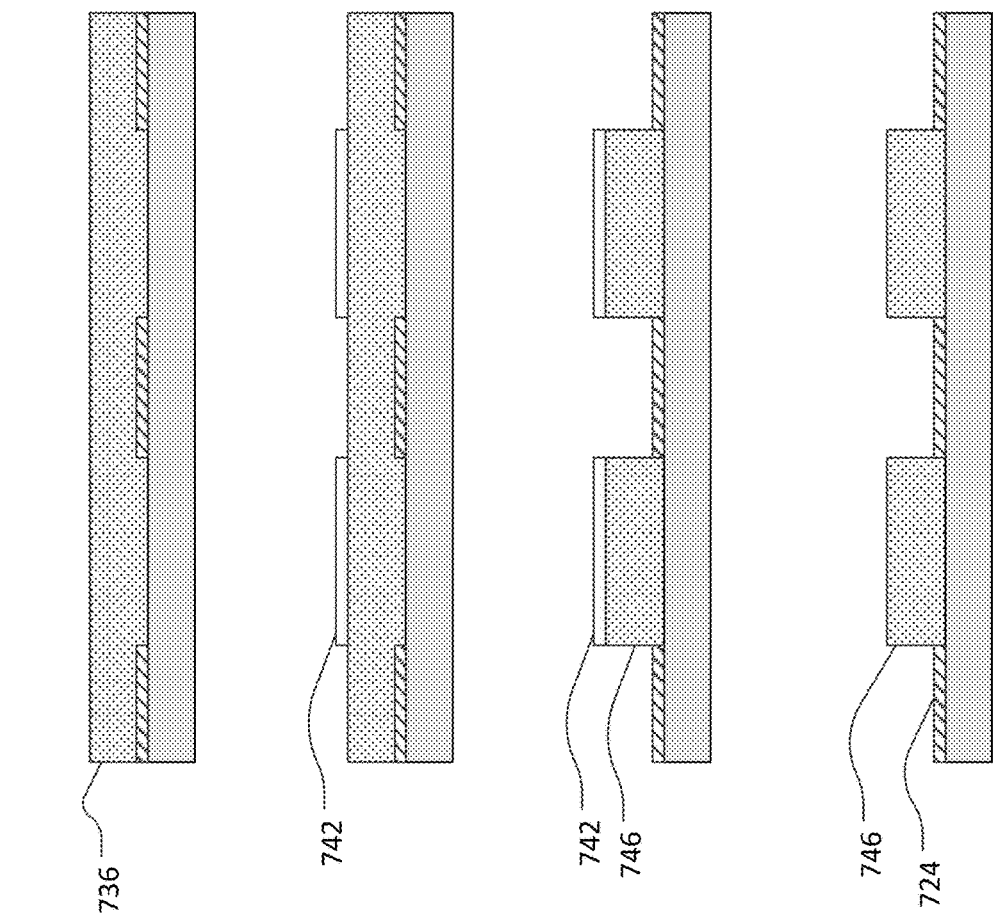

FIG. 7A and FIG. 7B are collectively a flow chart of a process 700 for forming a conductor pattern using dry etching and an etch-stop layer. The process 700 is or is included in the forming of conductor patterns at 630 of process 600. Process 700 is a subtractive or etching process that provides good control of conductor sidewall angles for the conductor pattern (e.g., of the IDT and/or fingers herein).

The process 700 starts at 720 with a plate of piezoelectric material 712 and ends at 750 with a completed XBAR conductor pattern 746 formed on the piezoelectric material plate 712. Piezoelectric plate 712 at 720 may be any of plates 110 and/or 410. The completed XBAR conductor pattern 746 on the plate at 750 may be a conductor pattern that is or that includes the IDT patterns and/or fingers described herein for XBAR devices.

Figure 7B:
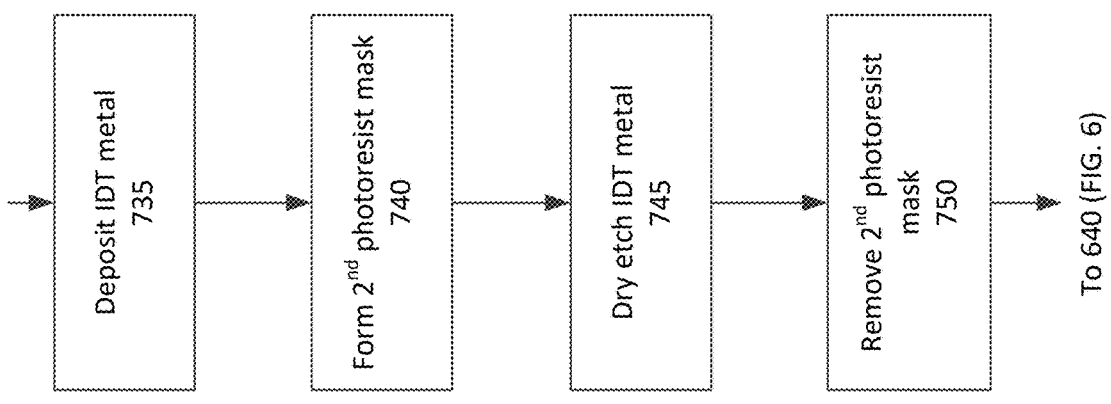

The flow chart of FIG. 7 includes only major process steps. Various conventional process steps (e.g. surface preparation, chemical mechanical processing (CMP), cleaning, inspection, baking, annealing, monitoring, testing, etc.) may be performed before, between, after, and during the steps shown in FIG. 7.

At 720 a first patterned photoresist mask 722 is formed over piezoelectric plate 712. The photoresist mask 722 may be a patterned lithography mask that is formed over areas of the piezoelectric plate 712 where the etch stop layer is not desired. These may be areas or locations where the desired conductor pattern of the IDT or fingers are to be formed. The photoresist mask 722 may be deposited over the piezoelectric plate and patterned to define the conductor pattern where the photoresist mask 722 exists after patterning.

At 725 an etch stop material 726 is deposited over the over the piezoelectric plate 712 and over the photoresist mask 722. The etch stop material 726 may be blanket deposited over all of the exposed top surfaces of the plate and mask to form an etch-stop layer. This etch-stop layer may include the etch stop material in the pattern of etch-stop layer 210 as well as etch stop material on the photoresist mask 722. The etch stop material 726 may be a material and/or be deposited as described for etch-stop layer 210.

At 730 the first photoresist mask 722 is removed. At 730 the photoresist mask 722 may then be removed, which removes, or lifts off, the etch stop material 726 which was deposited on the photoresist mask 722, thus leaving the pattern of etch-stop layer 210 on the piezoelectric plate 712. The first photoresist mask 722 is removed using a process that does not expose the surface of the piezoelectric plate 712 to reactive chemicals or a process that will damage or etch the piezoelectric plate 712.

At 735 IDT conductor material 736 is deposited over the etch stop material 724 and over the piezoelectric plate 712 where the first photoresist mask 722 was removed. The conductor material may be an electronically conductive material and/or material used to form a conductor pattern as noted herein. Depositing at 735 may be blanket depositing one or more metal layers in sequence over the top surfaces of the etch stop material 724 and the exposed piezoelectric plate 712. The IDT conductor material 736 may be blanket deposited over all of the exposed top surfaces of the etch-stop layer 724 and of the piezoelectric plate 712.

At 740 a patterned second photoresist mask 742 is formed over the IDT conductor material 736. The photoresist mask 742 may be a patterned lithography mask that is formed over areas of the IDT conductor material 736 where the IDT conductor material 746 is desired. These may be areas or locations where the desired conductor pattern of the IDT or fingers are to be formed. The photoresist mask 742 may be blanket deposited over the IDT conductor material 736 and then patterned to define the conductor pattern 746 where the photoresist mask 742 exists after patterning.

The patterned second photoresist mask 742 may function like an etch stop in that it will be impervious to and/or be etch magnitudes slower than the conductor material by the processes and chemicals used to etch the conductor material 736. Suitable photoresist materials may include oxides such as a light sensitive material, a light-sensitive organic material (e.g., a photopolymeric, photodecomposing, or photo-crosslinking photoresist), an oxide or a nitride.

At 745 IDT conductor material 736 is dry etched and removed by an anisotropic etch through the conductor where it is not protected by the second photoresist mask 742, thus forming conductor pattern 746. The conductor layer 736 can be etched, for example, by an anisotropic plasma etching, reactive ion etching, wet chemical etching, and other etching techniques. The etch may be a highly anisotropic, high-energy etch process that can damage (via chemical etch or physical sputtering) the piezoelectric layer where that layer is exposed to the etch.

The dry etch etches or removes the conductor over and to the etch stop material 724. Both, the second photoresist mask 742 and the etch stop material 724 are impervious, as previously defined, to the processes and chemicals used to etch the conductors. Alternatively, they are etched magnitudes slower than the conductor material by the processes and chemicals used to etch the conductors. Thus, this anisotropic etch does not remove the conductor material 736 under the second photoresist mask 742 and does not remove the etch stop material 724 since they are impervious and/or etched magnitudes slower. The conductor material 736 remaining under the second photoresist mask 742 and on the piezoelectric plate 712 is the conductor pattern desired for the IDT and/or fingers.

At 750 the second photoresist mask 742 is removed from the top surface of the conductor material 736. This leaves the pattern of desired conductor material 746 deposited directly onto the piezoelectric plate 712 and the etch stop material 724 between but not under the conductor material. The second photoresist mask 742 is removed using a process that does not expose the surface of the conductor to reactive chemicals or a process that will damage or etch the conductor material 746.

After removing at 750, the remaining desired conductor material 76 may be or include the IDT conductor and/or fingers described herein. It may be the conductor material in the XBAR device 200, such as the IDT fingers 236, 238. The remaining etch stop material 724 may be or be include etch stop layer 210.

Figure 8A:
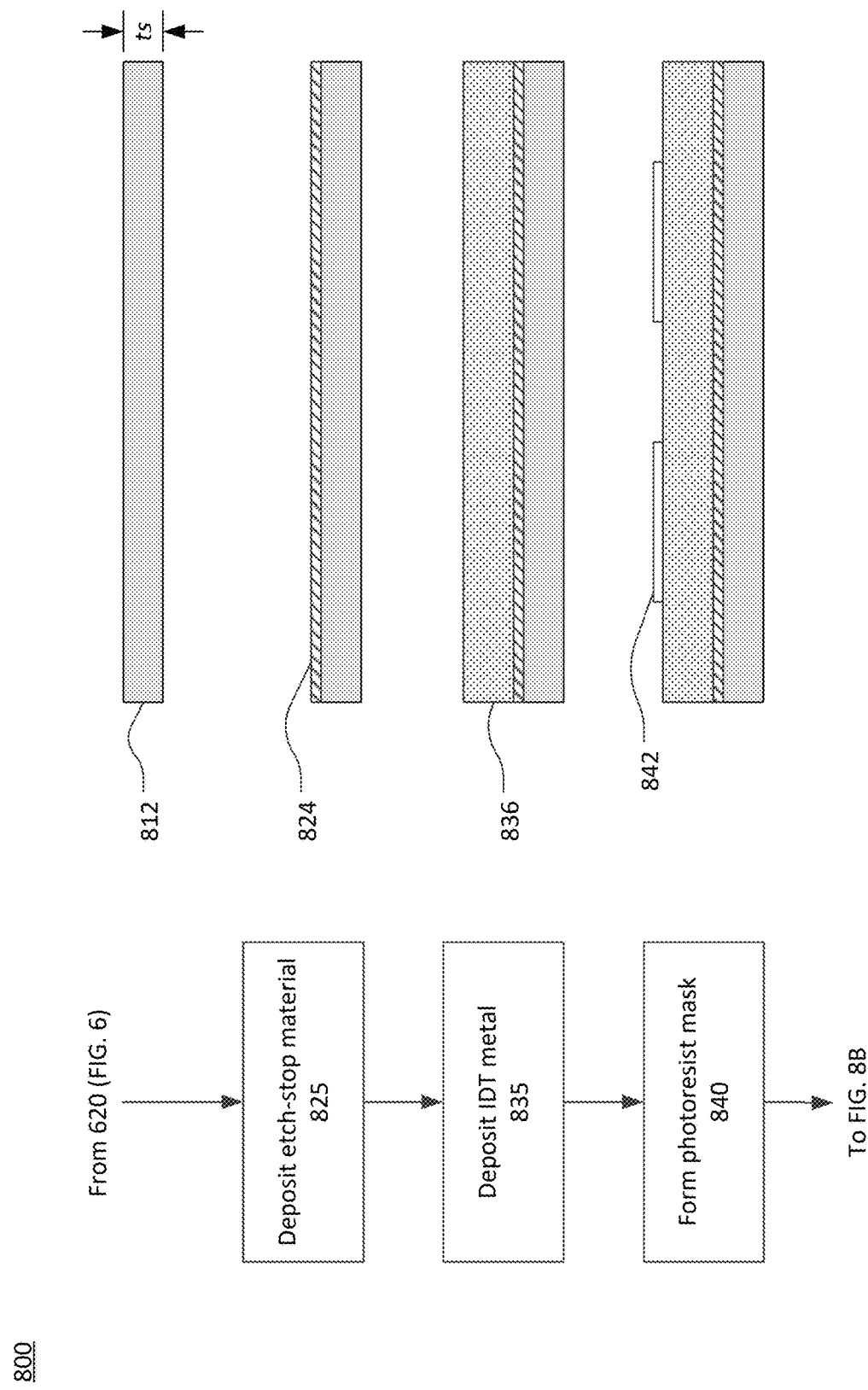
FIG. 8A and FIG. 8B are collectively a flow chart of another process for forming a conductor pattern using dry etching and an etch-stop layer.
Figure 8B:
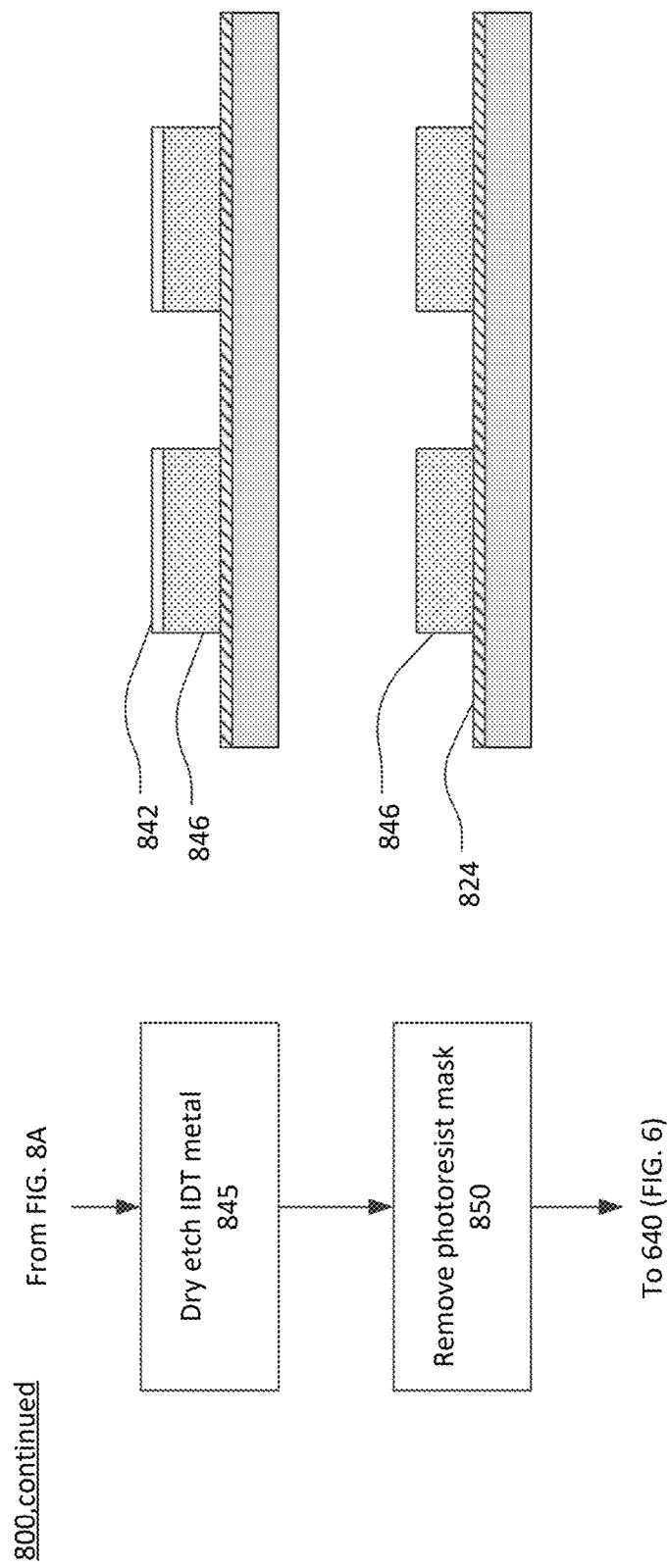

FIG. 8A and FIG. 8B are collectively a flow chart of another process 800 for forming a conductor pattern using dry etching and an etch-stop layer. The process 800 is or is included in the forming of conductor patterns at 630 of process 600. Process 800 is a subtractive or etching process that provides good control of conductor sidewall angles for the conductor pattern (e.g., of the IDT and/or fingers herein).

The process 800 starts at 825 with a plate of piezoelectric material 812 and ends at 850 with a completed XBAR conductor pattern 846 formed on the piezoelectric material plate 812. Piezoelectric plate 812 at 825 may be any of plates 110 and/or 410. The completed XBAR conductor pattern 846 on the plate at 850 may be a conductor pattern that is or that includes the IDT patterns and/or fingers described herein for XBAR devices.

The flow chart of FIG. 8 includes only major process steps. Various conventional process steps (e.g. surface preparation, chemical mechanical processing (CMP), cleaning, inspection, baking, annealing, monitoring, testing, etc.) may be performed before, between, after, and during the steps shown in FIG. 8.

At 825 an etch stop material 824 is deposited over the over the piezoelectric plate 812. The etch stop material 824 may be blanket deposited over all of the exposed top surfaces of the plate to form an etch-stop layer. The etch stop material 824 may be a material and/or be deposited as described for etch-stop layer 210.

At 835 IDT conductor material 836 is deposited over the etch stop material 824. The IDT conductor material 836 may be blanket deposited over all of the exposed top surfaces of the etch-stop layer. Depositing at 835 may be depositing one or more metal layers in sequence over the top surfaces of the etch stop material 824.

At 840 a patterned photoresist mask 842 is formed over the IDT conductor material 836. The photoresist mask 842 may be a patterned lithography mask that is formed over areas of the IDT conductor material 836 where the IDT conductor material 846 is desired. These may be areas or locations where the conductor pattern of the IDT or fingers are to be formed. The photoresist mask 842 may be blanket deposited over the IDT conductor material 836 and then patterned to define the conductor pattern 846 where the photoresist mask 842 exists after patterning.

The patterned photoresist mask 842 may function like an etch stop in that it will be impervious to and/or be etch magnitudes slower than the conductor material by the processes and chemicals used to etch the conductor material 836. Suitable photoresist materials may include oxides such as a light sensitive material, a light-sensitive organic material (e.g., a photopolymeric, photodecomposing, or photocrosslinking photoresist), an oxide or a nitride.

At 845 IDT conductor material 836 is dry etched and removed by an anisotropic etch through the conductor where it is not protected by the photoresist mask 842, thus forming conductor pattern 846. The conductor layer 836 can be etched, for example, by an anisotropic plasma etching, reactive ion etching, wet chemical etching, and other etching techniques. The etch may be a highly anisotropic, high-energy etch process that can damage (via chemical etch or physical sputtering) the piezoelectric layer where that layer is exposed to the etch.

The dry etch etches or removes the conductor over and to the etch stop material 824. Both, the photoresist mask 842 and the etch stop material 824 are impervious, as previously defined, to the processes and chemicals used to etch the conductors. Alternatively, they are etched magnitudes slower than the conductor material by the processes and chemicals used to etch the conductors. Thus, this anisotropic etch does not remove the conductor material 836 under the second photoresist mask 842 and does not remove the etch stop material 824 since they are impervious and/or etched magnitudes slower. The conductor material 836 remaining under the second photoresist mask 842 and on the etch stop material 824 is the conductor pattern desired for the IDT and/or fingers.

At 850 the photoresist mask 842 is removed from the top surface of the conductor material 836. This leaves the pattern of desired conductor material 846 deposited directly onto the etch stop material 824 between and under the conductor material 846. The photoresist mask 842 is removed using a process that does not expose the surface of the conductor material 846 to reactive chemicals or a process that will damage or etch the conductor material 846.

After removing at 850, the remaining desired conductor material 846 may be or include the IDT conductor and/or fingers described herein. It may be the conductor material in the XBAR device 300, such as the IDT fingers 336 and 338. The remaining etch stop material 824 may be or be include etch stop layer 310.

Using the subtractive or etching of each of processes 700 and 800 provides better control of conductor sidewall angles of the desired conductor material than a lift-off process. In some cases, processes 700 and 800 provide a predefined deposit-etched IDT with sharp sidewall angles by using a highly anisotropic, high-energy etch process that may damage (via chemical etch or physical sputtering) the piezoelectric layer, and by protecting the piezoelectric layer with a thin layer of insulating etch stop metal oxide layer that is deposited over it. By using the highly anisotropic, high-energy etch process and etch stop layer the processes 700 and 800 allow for better resolution of the IDTs as well as sharper vertical wall angle of the IDTs.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An acoustic resonator device comprising:
   a substrate having a front surface;
   a piezoelectric plate supported by the front surface of the substrate;
   interleaved fingers at a diaphragm of the piezoelectric plate spanning a cavity; and
   an etch-stop layer on a surface of the piezoelectric plate between the interleaved fingers,
   wherein the etch-stop layer is impervious to an etch process capable of forming the interleaved fingers.

2. The acoustic resonator device of claim 1, wherein the etch-stop layer is on the piezoelectric plate between but not under the interleaved fingers.

3. The acoustic resonator device of claim 1, wherein the etch-stop layer is on the piezoelectric plate between and under the interleaved fingers.

4. The acoustic resonator device of claim 1, wherein the piezoelectric plate is one of lithium niobate and lithium tantalate; and wherein the etch-stop layer is one of an oxide, sapphire, a nitride, silicon carbide, and diamond.

5. The acoustic resonator device of claim 4, wherein the etch-stop layer is aluminum oxide.

6. The acoustic resonator device of claim 4, wherein the etch-stop layer is a high thermal conductivity material selected from aluminum nitride, boron nitride, and the diamond.

7. The acoustic resonator device of claim 1, further comprising:
a front-side dielectric layer on the etch stop layer and on the interleaved fingers, wherein the diaphragm includes the piezoelectric plate, the front-side dielectric layer, and the etch-stop layer.

8. The acoustic resonator device of claim 7, wherein the front-side dielectric layer is $SiO_2$, $Si_3N_4$, or $Al_2O_3$.

9. The acoustic resonator device of claim 7, further comprising:
a passivation layer over the front-side dielectric layer.

10. The acoustic resonator device of claim 1, wherein the interleaved fingers and piezoelectric plate are configured such that a radio frequency signal applied to the interleaved fingers excites a shear primary acoustic mode within the piezoelectric plate, and wherein a direction of acoustic energy flow of the shear primary acoustic mode is substantially orthogonal to the front and back surfaces of the piezoelectric plate.

11. The acoustic resonator device of claim 1, wherein the piezoelectric plate is supported by the front surface of the substrate via one or more intermediate material layers.

12. A filter device, comprising:
a substrate having a front surface;
at least one piezoelectric plate supported by the front surface of the substrate;
a plurality of interdigital transducers (IDTs) of a respective plurality of acoustic resonators including a shunt resonator and a series resonator, interleaved fingers of each of the plurality of IDTs at a respective diaphragm of one or more diaphragms of the at least one piezoelectric plate spanning respective cavities; and
an etch-stop layer on a surface of the at least one piezoelectric plate between interleaved fingers of the plurality of IDTs,
wherein the etch-stop layer is impervious to an etch process capable of forming the interleaved fingers.

13. The filter device of claim 12, further comprising:
a frequency setting dielectric layer on a front surface of the etch-stop layer between the interleaved fingers of the IDT of the shunt resonator.

14. The filter device of claim 13, wherein:
the frequency setting dielectric layer is a first dielectric layer that has a first thickness that is greater than a second thickness of a second dielectric layer deposited between the fingers of the IDT of the series resonator,
a resonance frequency of the shunt resonator is set, at least in part, by the first thickness, and
a resonance frequency of the series resonator is set, at least in part, by the second thickness.

15. The filter device of claim 12, wherein the etch-stop layer is on the at least one piezoelectric plate between and under the interleaved fingers.

16. The filter device of claim 12, wherein the etch-stop layer is on the at least one piezoelectric plate between but not under the interleaved fingers.

17. A filter device, comprising:
a substrate having a front surface;
at least one piezoelectric plate supported by the front surface of the substrate;
a plurality of interdigital transducers (IDTs) of a respective plurality of acoustic resonators including at least one shunt resonator and at least series resonator, interleaved fingers of each of the plurality of IDTs disposed on a respective diaphragm of one or more diaphragms spanning respective cavities; and
an etch-stop layer on the at least one piezoelectric plate and between interleaved fingers of the plurality of IDTs,
wherein the etch-stop layer is a material configured to be impervious to at least one etch process capable of etching the interleaved fingers.

18. The filter device of claim 17, wherein the etch-stop layer is on the at least one piezoelectric plate between but not under the interleaved fingers.

19. The filter device of claim 17, wherein the etch-stop layer is on formed on the front surface of the at least one piezoelectric plate between and under the interleaved fingers.

20. The filter device of claim 17, wherein the at least one etch process is a highly anisotropic, high-energy chemical etch process or physical sputtering etch process.

\* \* \* \* \*